United States Patent [19]

Brunner

[11] Patent Number: 4,703,434

[45] Date of Patent: Oct. 27, 1987

[54] APPARATUS FOR MEASURING OVERLAY ERROR

[75] Inventor: Timothy A. Brunner, Norwalk, Conn.

[73] Assignee: The Perkin-Elmer Corporation, Norwalk, Conn.

[21] Appl. No.: 602,878

[22] Filed: Apr. 24, 1984

[51] Int. Cl.[4] .......................... G01B 9/02; G06F 15/60
[52] U.S. Cl. .................................. 364/488; 356/354; 356/356; 356/358
[58] Field of Search ................ 364/488, 359; 356/356, 356/400, 358, 354

[56] References Cited

U.S. PATENT DOCUMENTS

| | | | |
|---|---|---|---|
| 3,928,094 | 12/1975 | Angell | 148/187 |
| 3,955,072 | 5/1976 | Johannsmuier et al. | 364/559 |
| 4,167,337 | 9/1979 | Jaerisch et al. | 356/354 |
| 4,172,664 | 10/1979 | Charsky et al. | 356/356 |
| 4,330,213 | 5/1982 | Kleinknacht et al. | 364/563 |
| 4,408,884 | 10/1983 | Kleinknacht et al. | 356/355 |
| 4,445,776 | 5/1984 | Hyatt | 355/78 |
| 4,493,555 | 1/1985 | Reynolds | 356/358 |
| 4,515,481 | 5/1985 | Yamada et al. | 356/400 |
| 4,577,968 | 3/1986 | Makosch | 356/356 |
| 4,578,590 | 3/1986 | Wu | 356/400 |

Primary Examiner—Felix D. Gruber
Assistant Examiner—Danielle B. Laibowitz
Attorney, Agent, or Firm—Thomas P. Murphy; Edwin T. Grimes; Francis L. Masselle

[57] ABSTRACT

The present invention is directed to new and improved apparatus for measuring overlay error between a wafer pattern and a mask pattern projected onto the wafer pattern by a lithographic exposure instrument, which includes a grating mask; a grating wafer having reflective lines alternating with non-reflective spaces patterned like the mask pattern; the lithographic instrument having projection optics mounted to project an image of the mask on the wafer, and a mechanism for moving the grating mask and grating wafer relative to the projection optics; the grating on the wafer being offset from the grating on the mask forming Moire fringes corresponding to the overlay error between the wafer pattern and a mask pattern projected onto the wafer; a photodiode array wherein each photodiode corresponds to a pixel on the grating wafer; viewing optics mounted to project the Moire fringes onto the photodiode.

12 Claims, 10 Drawing Figures

APPARATUS FOR MEASURING OVERLAY ERROR

FIELD OF INVENTION

This invention is directed to apparatus for measuring overlay error and resolution between a wafer pattern and a mask pattern projected onto the wafer by a lithographic exposure tool or instrument.

BACKGROUND OF THE INVENTION

The object of a lithographic exposure tool is to put a mask pattern on top of an existing wafer pattern. The difference between the desired position and the actual position of the mask image on the existing wafer structure is called the overlay error. Heretofore, optical verniers were used for reading the differences in position of the first pattern with respect to the second pattern. To perform this test a photosensitive layer such as photoresist was deposited on the wafer by spinning and then the resist was exposed to a pattern. Thereafter, the resist was developed and the operators had to look at same under a microscope to determine the overlay error. This was time consuming. It required a judgment call on the part of the operators, and hence different operators obtained different results.

Further, the accuracy in setting up the machine might not be limited by how accurate the machine was, but could be limited by how accurate the test processing was.

As a result, it is an object of this invention to provide a new and improved apparatus for measuring overlay error which is substantially faster and more accurate.

Heretofore, a vibration test set was used for measuring the vibration of the mask image relative to the wafer stage of the lithographic tool. A pair of masks was used. One mask was loaded into the mask stage. The other mask was loaded into the wafer stage by means of removing the wafer chuck and installing a special holder. Each of the masks had three bands; a band of 5 micron wide vertical lines and spaces; a band of 5 micron wide horizontal lines and spaces; and a transparent horizontal band separating the other two. A detector was provided for each band. In operation, when the two masks were perfectly aligned, the image of the vertical lines in the vertical band on the first mask would coincide with the lines on the second mask at the wafer stage. The associated detector would measure the light transmitted to be approximately 50 percent of that sensed by the sensor monitoring the clear band. If the second mask at the wafer stage was moved horizontally 5 microns to the right or left, the light sensed would be approximately zero. Thus, variation of this signal was used to measure relative horizontal motion. In a like manner, the horizontal line bands were used to measure vertical motion. It is noted that this system used transmission. The detector was behind the second mask located in the wafer position, and hence the carriage could not be moved or the arc image would not hit the detector. As a result, this prior art system could only do static vibration testing.

Another object of the present invention, is to provide apparatus for effecting dynamic vibration testing.

SUMMARY OF THE INVENTION

Briefly, the present invention is directed to a new and improved apparatus for measuring overlay error between a wafer pattern and a mask pattern projected onto the wafer pattern by a lithographic exposure instrument, which includes a grating mask, a grating wafer, which has reflective lines alternating with non-reflective spaces patterned like the mask pattern. The lithographic instrument is provided with projection optics mounted to project an image of the mask on the wafer, and means for moving the grating mask and grating wafer relative to the projection optics. The grating on the wafer is offset from the grating on the mask forming Moire fringes corresponding to the overlay error between the wafer pattern and the mask pattern projected on to the wafer. A photodiode array is provided wherein each photodiode of the array corresponds to a pixel on the grating wafer. Viewing optics are mounted to project the Moire fringes onto the photodiode array, and computing means serve for outputting overlay error signals responsive to the output from the photodiode array.

According to one aspect of the invention adjusting means are provided for adjusting the projection optics responsive to the output of the computing means.

According to another aspect of the invention, means are provided for deliberately changing by a known amount the displacement of the mask with respect to the wafer, while storage means store the fringe shape for each of the pixels, thereby forming a calibration curve for determining overlay error from measurements of fringe intensity. In one form of the invention means are provided for sampling the fringe intensity output of each of the photodiodes of the photodiode array a plurality of times during each of a succession of time intervals for each of the pixels. The computing means is provided with means for comparing the intensity output with the calibration curve and outputting a corresponding overlay error for each of the pixels.

According to still another aspect of the invention the viewing optics comprises means for visually observing the contrast of the Moire fringes. Means are provided for adjusting the focus of the projection optics to maximize the contrast of the fringes and thereby maximize resolution.

There has thus been outlined rather broadly the more important features of the invention in order that the detailed description thereof that follows may be better understood and in order that the present contribution to the art may be better appreciated. There are, of course, additional features of the invention that will be described more fully hereinafter. Those skilled in the art will appreciate that the conception on which this disclosure is based may readily be utilized as the basis of the designing of other apparatus for carrying out the various purposes of the invention. It is important, therefore, that this disclosure be regarded as including such equivalent apparatus as do not depart from the spirit and scope of the invention.

Several embodiments of the invention have been chosen for purposes of illustration and description and are shown in the accompanying drawings forming a part of the specification.

DETAILED DESCRIPTION OF PRESENTLY PREFERRED EMBODIMENTS

Figure 1:
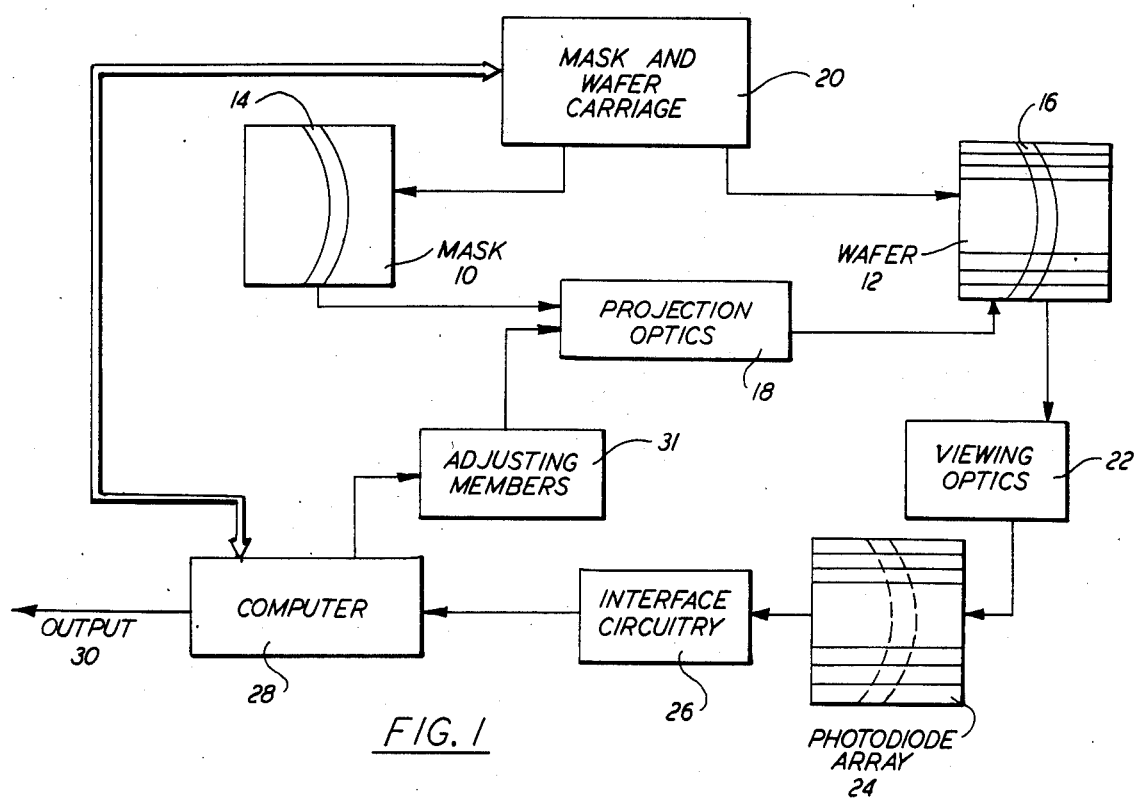
FIG. 1 is a block diagram of apparatus for measuring overlay error in a lithographic instrument according to the present invention.

As illustrated in the schematic drawing of FIG. 1, according to the invention, apparatus for measuring overlay error between a wafer pattern and a mask pattern projected on to the wafer by a lithographic exposure instrument includes a grating mask 10 and a grating wafer 12, which has reflective lines alternating with non-reflective spaces patterned like said mask. Any suitable lithographic exposure instrument may be calibrated and tested according to the invention such as, for example, those described in U.S. Pat. Nos. 4,011,011; 4,068,947; 3,748,015; and 4,293,186; or a Micralign® Model 500 instrument or a Micralign® Model 300 instrument, as manufactured by The Perkin-Elmer Corporation.

A narrow arcuate slit-shaped region or area 14 of the mask 10 is defined by an illuminating system, not shown. This arcuate area is imaged on the surface of the wafer 12 as indicated at 16 by means of the projection optics 18 of the lithographic instrument being tested. In addition, the lithographic instrument is provided with a mask and wafer carriage 20 which locks the mask and wafer together and sweeps them through the arcuate slit-shaped area to expose the entire wafer. Further, the lithographic instrument is provided with wide field viewing optics 22 which serve to project a reflected image of the arc-shaped region 16 onto an array of photodiodes 24. With this system fringe intensity is measured at a plurality of positions, such as for example, 28 positions or pixels along the arc. The output of the photodiode array is preamplified and then measured by a voltmeter in an interface circuit 26 before being inputted to a computer 28. The computer 28 outputs at 30 overlay error signals responsive to the output from the said photodiode array. Adjusting members 31 serve to adjust the projection optics 18 of the instrument either manually or corresponding to the output of the computer 28.

Figure 2:
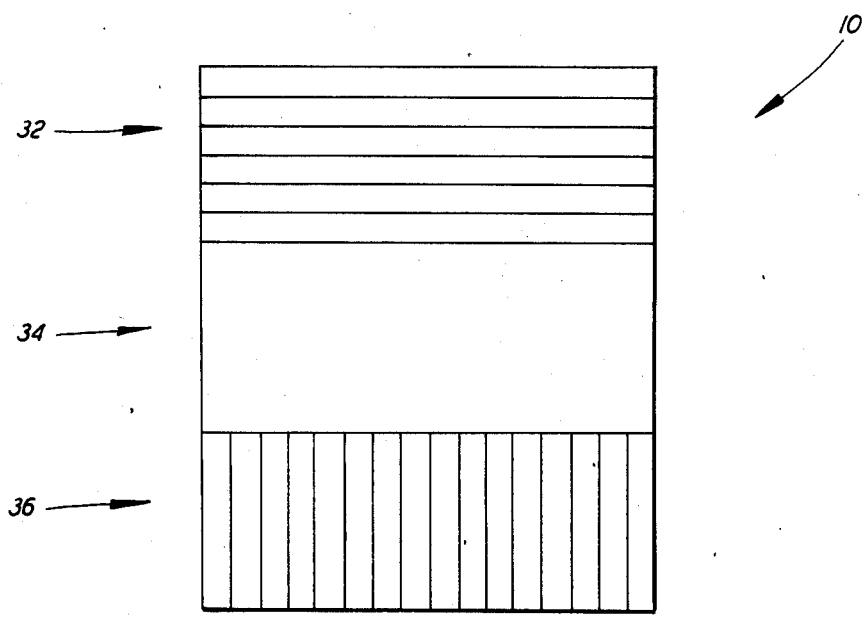
FIG. 2 is an enlarged plan view of a mask element lined according to the concepts of the present invention.

As seen in FIG. 2, in one form thereof, the mask 10 has a first grating pattern indicated at 32 which comprises a plurality of chrome horizontal lines alternating with a like plurality of clear spaces of the same width. The pitch is between about 2 and about 6 microns, for example. The mask has a second area indicated at 34, which is clear. A third grating pattern is indicated at 36 which is like the pattern at 32 except that the lines run vertically. That is, there are a plurality of chrome vertical lines alternating with a light plurality of clear spaces with the same width. When the results of a combination of horizontal and vertical lines are put together a vector is formed having both components. The pitch is between about 2 and about 6 microns, for example. The mask must have very accurate pattern placement. For greater accuracy, it is desirable to have a plurality of horizontal patterns and another plurality of vertical patterns all on the same mask.

The wafer 12, FIG. 1, can be an amplitude grating or a phase grating. The amplitude grating has reflective lines alternating with non-reflective spaces, patterned exactly like the mask. One suitable fabrication process includes the following steps: spinning photoresist mixed with a black dye onto a silicon wafer, postbaking, sputtering 0.1 microns of bright chrome on top, spinning on 1 micron of photoresist, and pre-baking. Said process further includes the steps of exposing the wafer using the grating mask and then developing the photoresist. The net result is an amplitude grating having bright chrome lines on top of a black dyed resist.

A phase grating wafer is one which has one portion or lines having a different phase delay than another portion or lines. One specific example is a wafer having a reflective surface and having lines of an inorganic transparent compound such as $SiO_2$ for example, deposited thereon. Another example is a wafer having a reflective chrome surface with lines of photoresist deposited thereon. As a result there is provided a wafer having alternating lines where there is a phase delay with lines where there is no phase delay. The thickness of the coatings determines the phase differential.

Figure 3:
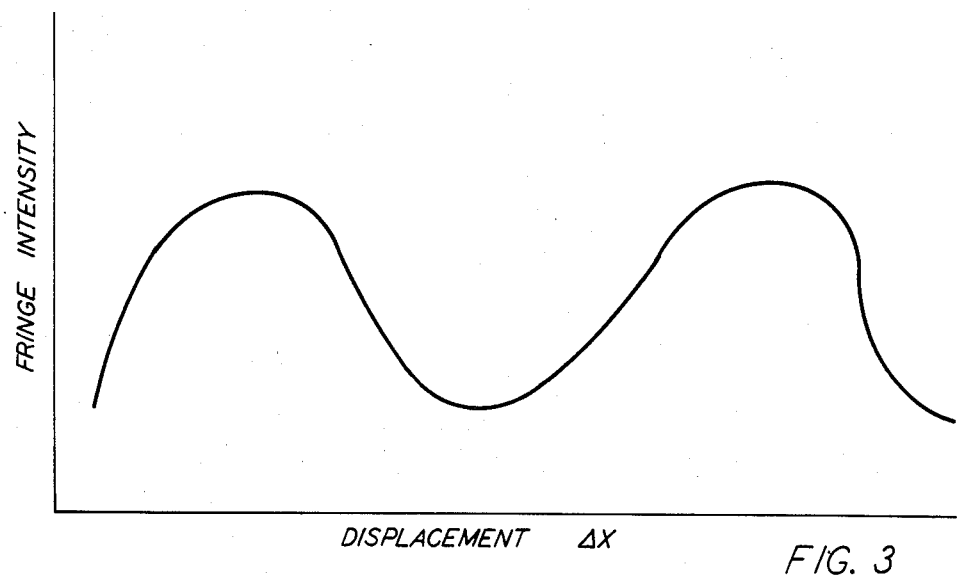
FIG. 3 is a plot of the fringe intensity versus displacement.

When making a measurement, a grating mask and a matching grating wafer are loaded into a lithographic instrument, and Moire fringes can be observed along the arc-shaped image through the viewing optics. The fringe intensity is a periodic function of the displacement between mask and wafer or the overlay error component perpendicular to the grating lines, as shown in FIG. 3. The period of the function, or the change in overlay error needed to go from one point to the adjacent point is equal to the pitch of the grating. A 1/60th second integration time for the photodiode arrays is used so that the flicker of the illumination source does not affect the results.

Figure 4:
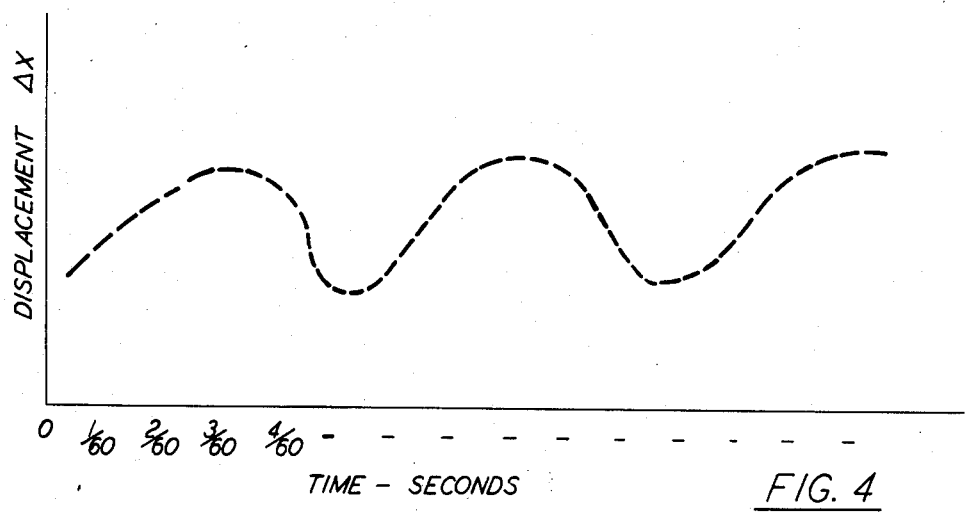
FIG. 4 is a plot of the overlay error components as a function of time.

FIG. 4 shows a plot of the overlay error components as a function of time. Thus, an error reading is made every 1/60th of a second. This shows that the overlay error depends on time, which gives vibration. If there was no vibration the curve in FIG. 4 would be a straight line.

Now referring to FIG. 3 again, if the mask and wafer are substantially in alignment, the fringe intensity is greatest and the curve in FIG. 3 shows a peak. When the mask and wafer are at maximum offset the fringe intensity is at its minimum and the curve in FIG. 3 shows a valley. I have found that it is desirable to set the overlay error so that the readings appear halfway on the curve. This makes the readings very sensitive to small changes, because they are on the curve at the point of maximum slope. In other words, small changes in overlay doesn't change the intensity signal very much when they are near the peak or the valley of the curve. In order to maintain the overlay error readings, or capture range, on one side of the curve near the middle, the pitch, i.e. distance from peak to peak of the mask and wafer line pattern must be selected corresponding to the precision of the instrument being tested. For example, if the instrument has an overlay precision of plus or minus ½ micron it is within the range of a mask and pattern having a 6 micron pitch. That is, the capture range is about plus or minus the pitch divided by 4. Therefore, a 6 micron pitch has a plus or minus 1.5 micron capture range. If the machine has a precision of ½ micron, it is within this range.

Figure 5:
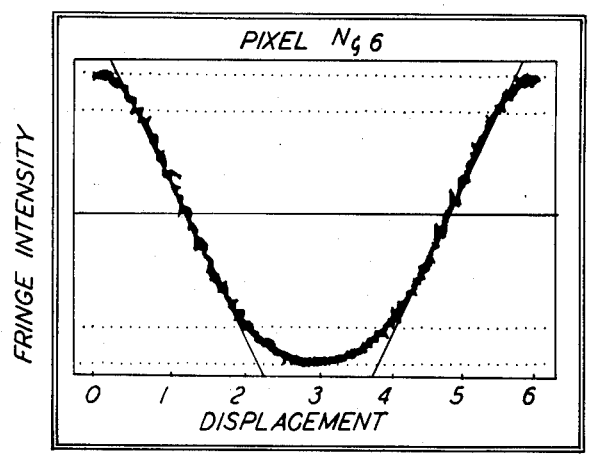
FIG. 5 is a plot of overlay error versus fringe intensity for one pixel.

To calibrate the results, the overlay error is swept at a uniform rate and the fringe intensity at each pixel versus time is observed, as shown in FIG. 4. Since the overlay error changes by the pitch, i.e. 6 microns for example, from one peak to the next, the data from all of the fringes of FIG. 4 can be put into a calibrated plot of fringe intensity versus overlay error as seen in FIG. 5. That is, each pixel is calibrated individually. The displacement ($\Delta X$ or $\Delta Y$) of the mask with respect to the wafer is deliberately changed a known amount and the fringe shape is traced out. A plurality of these fringes, such as 8 for example, are plotted on top of each other and they all fall substantially on the same curve. The fringe shape for each of the 28 pixels is stored in the computer memory. This calibration curve is then used to determine overlay error from measurements of the fringe intensity.

Typical results are shown in Table 1. Five consecutive sets of measurements each separated by 1/60th second, show that the repeatability is roughly plus or minus 0.02 microns.

TABLE 1

| PIXEL | #1 | #2 | #3 | #4 | #5 | AVE | DEV |
|---|---|---|---|---|---|---|---|
| 1 | −.59 | −.59 | −.58 | −.57 | −.58 | −.58 μm | −.15 μm |
| 2 | −.46 | −.46 | −.46 | −.44 | −.46 | −.46 | −.03 |
| 3 | −.46 | −.46 | −.46 | −.44 | −.46 | −.45 | −.04 |
| 4 | −.41 | −.41 | −.41 | −.39 | −.41 | −.41 | −0.00 |
| 5 | −.39 | −.39 | −.39 | −.37 | −.39 | −.39 | +.01 |
| 6 | −.40 | −.40 | −.41 | −.38 | −.40 | −.40 | −.01 |
| 7 | −.37 | −.37 | −.38 | −.35 | −.37 | −.37 | +.01 |
| 8 | −.35 | −.35 | −.36 | −.34 | −.36 | −.35 | +.02 |
| 9 | −.33 | −.34 | −.34 | −.32 | −.34 | −.33 | +.03 |
| 10 | −.32 | −.33 | −.33 | −.32 | −.33 | −.33 | +.03 |
| 11 | −.32 | −.33 | −.32 | −.31 | −.32 | −.32 | +.02 |
| 12 | −.14 | −.15 | −.13 | −.11 | −.12 | −.13 | +.20 |
| 13 | **** | **** | **** | **** | **** | ****** | |
| 14 | −.26 | −.28 | −.26 | −.26 | −.27 | −.27 | +.05 |
| 15 | −.25 | −.27 | −.25 | −.25 | −.26 | −.26 | +.05 |
| 16 | −.25 | −.26 | −.25 | −.24 | −.25 | −.25 | +.05 |
| 17 | −.33 | −.34 | −.33 | −.32 | −.33 | −.33 | −.04 |
| 18 | −.35 | −.36 | −.35 | −.34 | −.35 | −.35 | −.07 |
| 19 | −.33 | −.33 | −.32 | −.32 | −.32 | −.32 | −.05 |
| 20 | −.28 | −.29 | −.28 | −.27 | −.28 | −.28 | −.02 |
| 21 | −.26 | −.27 | −.26 | −.25 | −.27 | −.26 | −.01 |
| 22 | −.23 | −.24 | −.22 | −.23 | −.24 | −.23 | +.01 |
| 23 | −.19 | −.19 | −.17 | −.18 | −.19 | −.18 | +.05 |
| 24 | −.18 | −.18 | −.15 | −.17 | −.17 | −.17 | +.06 |
| 25 | −.21 | −.21 | −.19 | −.21 | −.20 | −.20 | +.01 |
| 26 | −.20 | −.19 | −.17 | −.19 | −.19 | −.19 | +.02 |
| 27 | −.41 | −.41 | −.39 | −.41 | −.41 | −.40 | −.21 |
| 28 | **** | **** | **** | **** | **** | ****** | |

AVERAGE: −.32 μm

Figure 6:
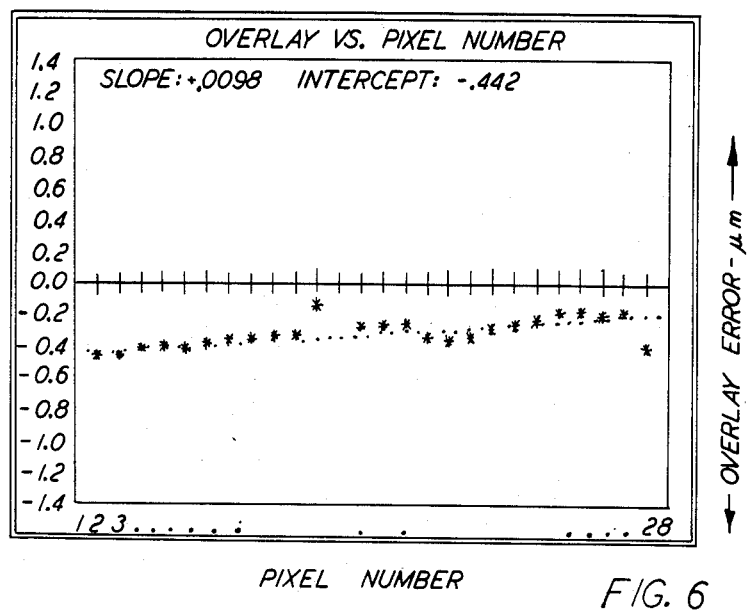
FIG. 6 is a plot of overlay error versus pixel number.

FIG. 6 shows the average overlay error versus pixel number. The deviation from a straight line is significantly less than 0.1 microns except at three points near the edge of the pattern area of the mask. By allowing the mask and wafer to scan, overlay error across the entire wafer can be measured.

Figure 7A:
FIG. 7a is a plot showing measured overlay error components after a 10 ppm (parts per million) magnification change was commanded.
Figure 7B:
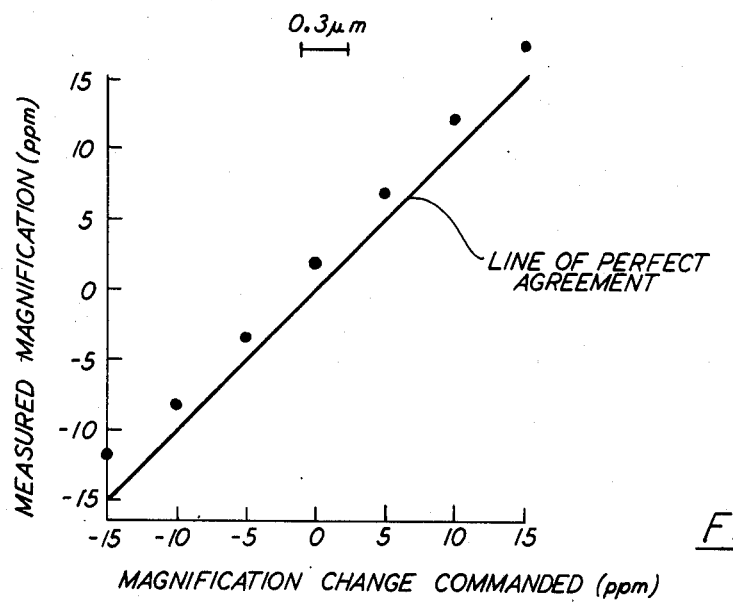
FIG. 7b is a plot of the commanded magnification change versus the measured magnification change.

To further illustrate the utility of the invention attention is directed to FIGS. 7a and 7b. FIG. 7a is a plot showing measured overlay error components or vectors after a 10 ppm (parts per million) magnification change was commanded. This test was made on a Perkin-Elmer Micralign ® Model 500 instrument fitted with a Moire fringe apparatus. FIG. 7b shows a plot of the commanded magnification change versus the measured magnification change. It will be appreciated that there is very close agreement apart from an unimportant offset, which indicates that what the machine called the overlay error was actually something like 2 ppm. This is really very close.

Figure 8:
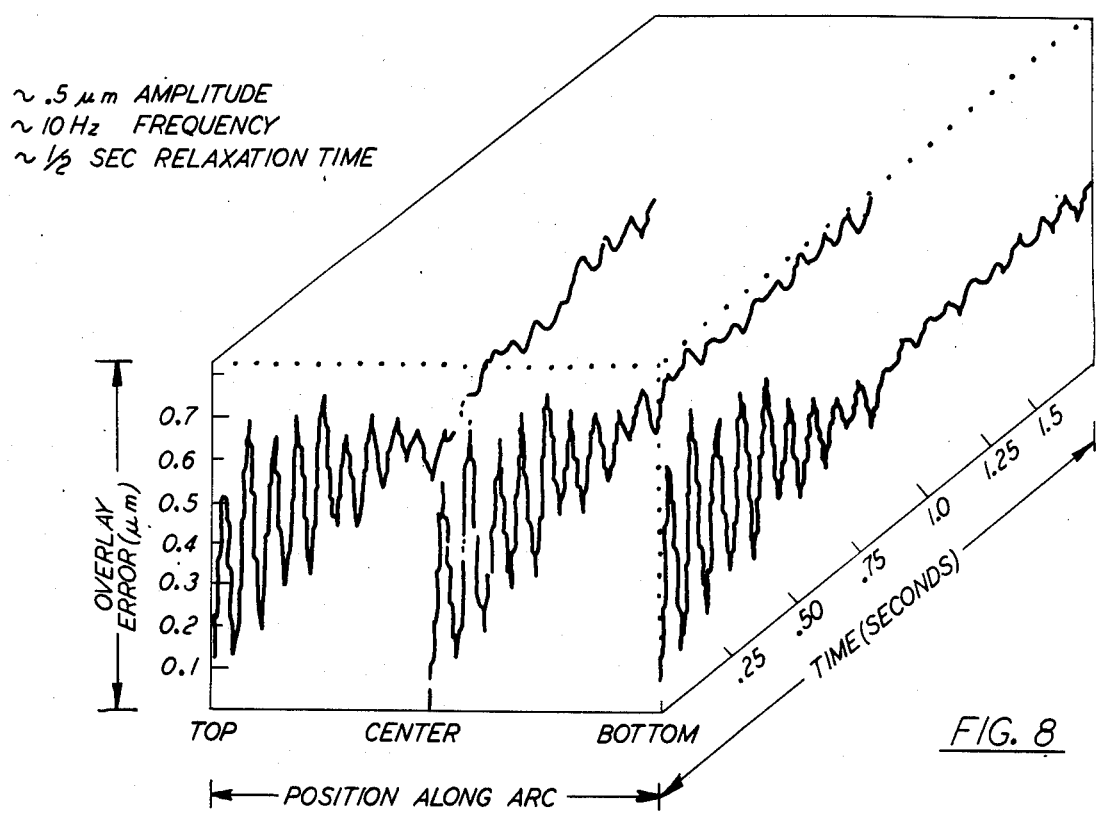
FIG. 8 is a plot showing overlay error versus time immediately after striking a lithographic exposure instrument.

FIG. 8 is a plot showing overlay error versus time immediately after striking the Perkin-Elmer Micralign ® Model 500 instrument. This is an example of the vibration error being measured where a data point was taken once every 60th of a second after a physical blow was delivered to the instrument. This Fig. shows how the vibration stabilizes out. Instead of showing all of the points along the arc (element 16 in FIG. 1), FIG. 8 only shows three points, i.e. top, center and bottom for purposes of simplification. It will be appreciated that all three curves show substantially the same thing. This again gives an example of the utility of the present system.

Figure 9:
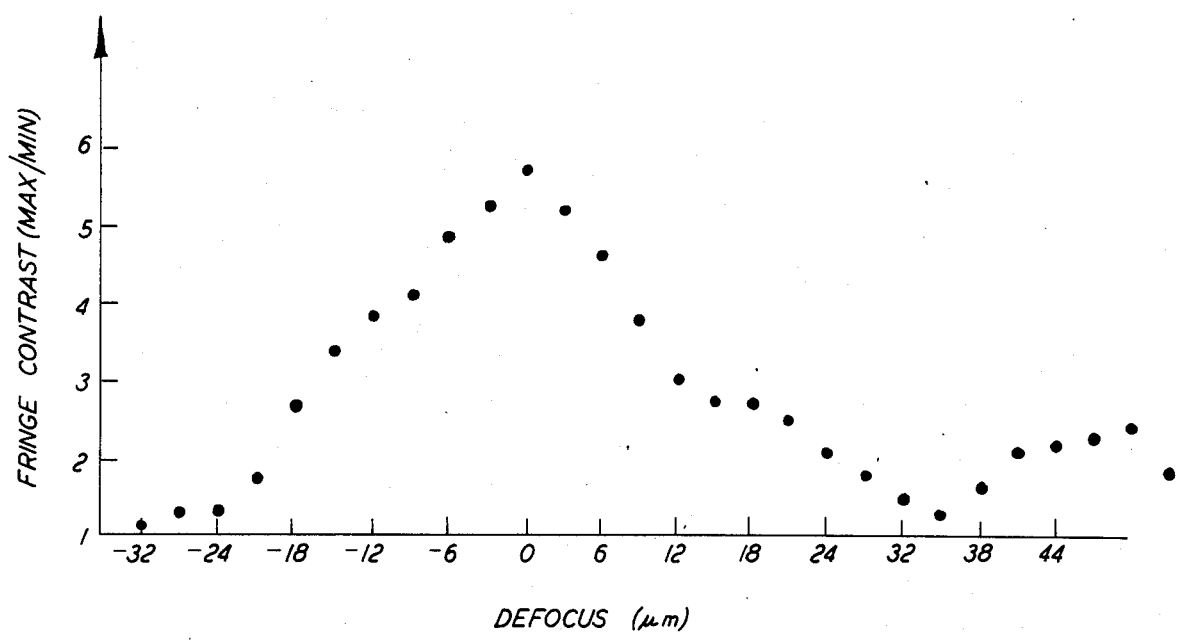
FIG. 9 is a plot showing the relationship of fringe contrast versus defocus.

The contrast of the Moire fringes has information about the resolution of the lithographic instrument, i.e. sharp fringes correspond to good imagery. One way of utilizing this information in a qualitative way to maximize resolution is to set up the instrument to form Moire fringes. Then a screw or knob on the instrument, i.e. adjusting one of the adjusting members 31, is manipulated to change the focus while observing the contrast of the fringes, thereby to maximize the contrast of the fringes. That is, the quality of the fringes is observed as a function of some adjusting member on the machine to thereby maximize resolution. FIG. 9 is a plot showing the relationship of fringe contrast versus defocus. This curve provides evidence that the fringe contrast can be used to sense defocus. The Perkin-Elmer Micralign ® Model 500 instrument fitted with a Moire fringe apparatus was used. The curved arc (element 16 in FIG. 1) was tilted so that the top of the arc was positively defocused, the middle of the arc was perfectly focused and the bottom of the arc was negatively defocused. The fringe intensity was measured as a function of the position along the arc with this tilt. This shows on the fringe contrast varies and gives an indication of the sensitivity of the system. In operation, the tilt can be adjusted until the whole line is straight at which time the system is in focus.

From the foregoing disclosure, it can be seen that the instant invention does indeed provide an improved apparatus for measuring overlay error between a wafer pattern and mask pattern projected onto the wafer by a lithographic exposure instrument, as compared to prior art such apparatus.

Although certain particular embodiments of the invention have been herein disclosed for purposes of explanation, various modifications thereof, after study of the specification, will be apparent to those skilled in the art to which the invention pertains.

What is claimed is:
1. Apparatus for measuring overlay error between a wafer pattern and a mask pattern projected onto the wafer by a lithographic exposure instrument comprising:
   a grating mask;
   a reflective grating wafer patterned substantially the same as said mask;
   said lithographic instrument having projection optics mounted to project an arcuate image of said mask on said wafer, and means for moving said grating mask and grating wafer relative to said projection optics;

the grating on said wafer being offset from the grating on said mask forming Moire fringes corresponding to the overlay error between the wafer pattern and the mask pattern projected onto the wafer;

a photodiode array, deposed to detect said arcuate image, each photodiode of said photodiode array corresponding to a pixel on said grating wafer, and providing an output representative of the intensity of said arcuate image;

viewing optics mounted to project said Moire fringes on to said photodiode array; and computing means for outputting overlay error signals responsive to the output from said photodiode array.

2. Apparatus according to claim 1 wherein said grating mask has a grating pattern with a pitch of from about 2 to about 6 microns.

3. Apparatus according to claim 1 wherein said wafer has an amplitude grating.

4. Apparatus according to claim 1 wherein said wafer has a phase grating.

5. Apparatus according to claim 1 wherein the precision of said lithographic exposure instrument in microns is less than the pitch of the grating pattern on said grating mask divided by four.

6. Apparatus according to claim 1 wherein said wafer grating has a plurality of horizontally disposed reflective lines alternating with non-reflective spaces and a plurality of vertically disposed reflective lines alternating with nonreflective spaces patterned like said mask.

7. Apparatus according to claim 1 further comprising adjusting means for adjusting said projection optics responsive to the output of said computing means.

8. Apparatus according to claim 1 comprising means for sampling the output of each of the photodiodes of said photodiode array a plurality of times during each of a succession of time intervals for each of said pixels, said computing means comprising means for computing overlay error during each of said time intervals for each of said pixels.

9. Apparatus according to claim 1 comprising means for deliberately changing by a known amount the displacement of said mask with respect to said wafer; storage means for storing the fringe shape for each of said pixels thereby forming a calibration curve for determining overlay error from measurements of fringe intensity.

10. Apparatus according to claim 9 comprising means for sampling fringe intensity output of each of the photodiodes of said photodiode array a plurality of times during each of a succession of time intervals for each of said pixels; said computing means comprising means for comparing said intensity output with said calibration curve and outputting a corresponding overlay error for each of said pixels.

11. Apparatus according to claim 9 comprising means for adjusting said projection optics responsive to said overlay error.

12. Apparatus according to claim 1 wherein said viewing optics comprises means for visually observing the contrast of said Moire fringes; and means for adjusting the focus of said projection optics to maximize the contrast of said fringes and thereby maximize resolution.

* * * * *